United States Patent
Gels et al.

(10) Patent No.: US 7,353,006 B2
(45) Date of Patent: Apr. 1, 2008

(54) CLOSED LOOP POWER CONTROL OF NON-CONSTANT ENVELOPE WAVEFORMS USING SAMPLE/HOLD

(75) Inventors: Robert G. Gels, Boston, MA (US); Sanjay Nandipaku, North Billerica, MA (US)

(73) Assignee: Analog Devices, Inc., Norwood, MA (US)

( * ) Notice: Subject to any disclaimer, the term of this patent is extended or adjusted under 35 U.S.C. 154(b) by 360 days.

(21) Appl. No.: 10/790,911

(22) Filed: Mar. 2, 2004

(65) Prior Publication Data

US 2004/0235437 A1   Nov. 25, 2004

Related U.S. Application Data

(60) Provisional application No. 60/454,032, filed on Mar. 12, 2003.

(51) Int. Cl.
   *H04B 1/04* (2006.01)
(52) U.S. Cl. .................. 455/126; 455/127.1; 455/108; 455/116
(58) Field of Classification Search ................ 455/126, 455/127.1, 127.3, 127.2, 108, 116, 522, 115.1, 455/127.4, 127.5, 69; 330/149
   See application file for complete search history.

(56) References Cited

U.S. PATENT DOCUMENTS

| | | | |
|---|---|---|---|
| 5,054,116 A | | 10/1991 | Davidson |
| 5,196,806 A | * | 3/1993 | Ichihara ................... 455/127.1 |
| 5,379,346 A | * | 1/1995 | Pecora et al. ............... 455/106 |
| 5,507,016 A | * | 4/1996 | Okuhara ..................... 455/126 |
| 5,656,929 A | * | 8/1997 | Humpherys .............. 455/127.2 |
| 5,737,697 A | * | 4/1998 | Yamada ..................... 455/126 |
| 5,802,451 A | * | 9/1998 | Adachi et al. .............. 455/126 |
| 5,834,979 A | * | 11/1998 | Yatsuka ...................... 455/113 |
| 6,091,296 A | * | 7/2000 | Rha ........................... 330/149 |
| 6,212,367 B1 | * | 4/2001 | Tolson ........................ 455/126 |
| 6,240,144 B1 | * | 5/2001 | Ha .............................. 330/149 |
| 6,452,446 B1 | * | 9/2002 | Eisenberg et al. .......... 330/149 |
| 6,566,944 B1 | * | 5/2003 | Pehlke et al. ............... 455/108 |
| 6,580,901 B1 | * | 6/2003 | Mochizuki ............... 455/127.1 |
| 6,617,930 B2 | * | 9/2003 | Nitta .......................... 455/126 |
| 6,795,712 B1 | * | 9/2004 | Vakilian et al. ............. 455/522 |
| 2003/0092407 A1 | * | 5/2003 | Nitta .......................... 455/127 |

(Continued)

FOREIGN PATENT DOCUMENTS

EP  0654899  5/1995

(Continued)

*Primary Examiner*—Lana Le
(74) *Attorney, Agent, or Firm*—Gauthier & Connors LLP

(57) ABSTRACT

A radio frequency output power control system for use in communication systems is disclosed. The power control system is used for a modulation scheme having a non-constant amplitude envelope and comprises a power amplifier having a power amplifier input for receiving an input signal with a non-constant amplitude envelope, a power control input for receiving a power control input, and a power amplifier output for providing an amplified output signal. The power control system also includes a track and hold circuit for tracking a measured reference power signal that is representative of a modulation of the input signal, and subtraction means for subtracting an output of the track and hold circuit from the measured reference power signal to provide a difference signal that is coupled to the power control input.

20 Claims, 4 Drawing Sheets

U.S. PATENT DOCUMENTS

| | | | |
|---|---|---|---|
| 2003/0139153 A1 | 7/2003 | McMorrow et al. | |
| 2004/0166802 A1* | 8/2004 | McKay et al. | 455/15 |
| 2006/0111060 A1* | 5/2006 | Kuriyama et al. | 455/127.2 |

FOREIGN PATENT DOCUMENTS

| | | | |
|---|---|---|---|
| EP | 1276232 | | 1/2003 |
| JP | 05-22159 | * | 1/1993 |
| JP | 06-53919 | * | 2/1994 |
| JP | 06-177680 | * | 6/1994 |
| JP | 06177680 | | 6/1994 |
| JP | 09199963 | | 7/1997 |
| WO | WO 97/05697 | | 2/1997 |
| WO | WO 01/03292 | | 1/2001 |

* cited by examiner

CLOSED LOOP POWER CONTROL OF NON-CONSTANT ENVELOPE WAVEFORMS USING SAMPLE/HOLD

PRIORITY

The present application claims priority to U.S. Provisional Patent Application Ser. No. 60/454,032 filed Mar. 12, 2003.

BACKGROUND

The invention relates to the field of RF power detectors and controllers, and in particular to RF power detectors and controllers used in mobile handset terminals for wireless applications.

The demand for greater bandwidth for mobile systems in a highly competitive landscape has forced network providers to look for low cost ways to expand existing networks. One such system that is being used is Enhanced Data Rate for Global Evolution (EDGE). The EDGE system enables the providers to expand the existing Global System for Mobile Communications (GSM) system, the standard for 70% of the worldwide market, to offer bandwidths of up to 300 kbps. This bandwidth and capacity extension can be accomplished with a relatively small upgrade to the existing infrastructure network. The system, however, does present some technical challenges. One of these is accurate power control in the transmitter section in the handset terminals.

Accurate power control is required by many RF wireless communications standards, such as GSM, CDMA, EDGE, as disclosed, for example, in U.S. Published Patent Application No. 2003/0139153 (the disclosure of which is hereby incorporated by reference), etc. This necessarily accurate power control may be difficult to implement or achieve using open loop techniques because of variations in the gains of various components due to temperature variations, frequency dependences, power supply variations, and manufacturing tolerances. It may be expensive or impossible to calibrate for all these variables during manufacture. Closed loop control of the power or amplitude of the signal is desirable for these reasons.

Closed Loop power control for Non-Constant Envelope (NCE) modulated signals, such as CDMA or EDGE however, is complicated by the fact that the instantaneous amplitude of the signal varies during transmission. Conventional systems for constant envelope modulation waveforms may compare the measured output power level to a ramp (or power profile) signal in a feedback loop. Applying this technique to non-constant waveforms, which have amplitude variations, has the effect of wiping off the desired amplitude information these signals, creating unacceptable distortion of the modulated waveform. This technique is therefore unsuitable for NCE signals.

Closed loop power or amplitude control of NCE waveforms may be accomplished by means of a gain measurement, where a priori power level information of a modulated reference signal is used and compared with a measurement of the power level of the final output signal. This a priori information provides the necessary information regarding the amplitude variations of the original modulated signal for the feedback scheme to work properly. This method of closed loop feedback however, may be sensitive to variations in the average input power applied to the reference signal input. In many applications, the reference signal average power will exhibit these variations due to a number of factors, such as temperature, frequency and part-to-part variations, making this technique unsuitable.

There is a need, therefore, for an efficient and economical system for providing closed loop power control.

SUMMARY

The invention provides a radio frequency output power control system for use in communication systems. The power control system is used for a modulation scheme having a non-constant amplitude envelope and comprises a power amplifier having a power amplifier input for receiving an input signal with a non-constant amplitude envelope, a power control input for receiving a power control input, and a power amplifier output for providing an amplified output signal. The power control system also includes a track and hold circuit for tracking a measured reference power signal that is representative of a modulation of the input signal, and subtraction means for subtracting an output of the track and hold circuit from the measured reference power signal to provide a difference signal that is coupled to the power control input in accordance with an embodiment of the invention.

BRIEF DESCRIPTION OF THE DRAWINGS

The following description may be further understood with reference to the accompanying drawings in which.

The drawings are shown for illustrative purposes only.

DETAILED DESCRIPTION OF THE ILLUSTRATED EMBODIMENTS

In accordance with various embodiments of the invention, a reference signal may be used to provide information regarding a desired power level of the output signal. The reference signal may be a modulated signal that has, for example, a frequency that is the same as the transmitted frequency or may use an intermediate frequency (IF) as the reference signal. The reference signal provides envelope information regarding the desired power level of the output signal, and this information is critical for this system. A further embodiment of the invention involves using the baseband I and Q signals as the reference signal.

Figure 1:
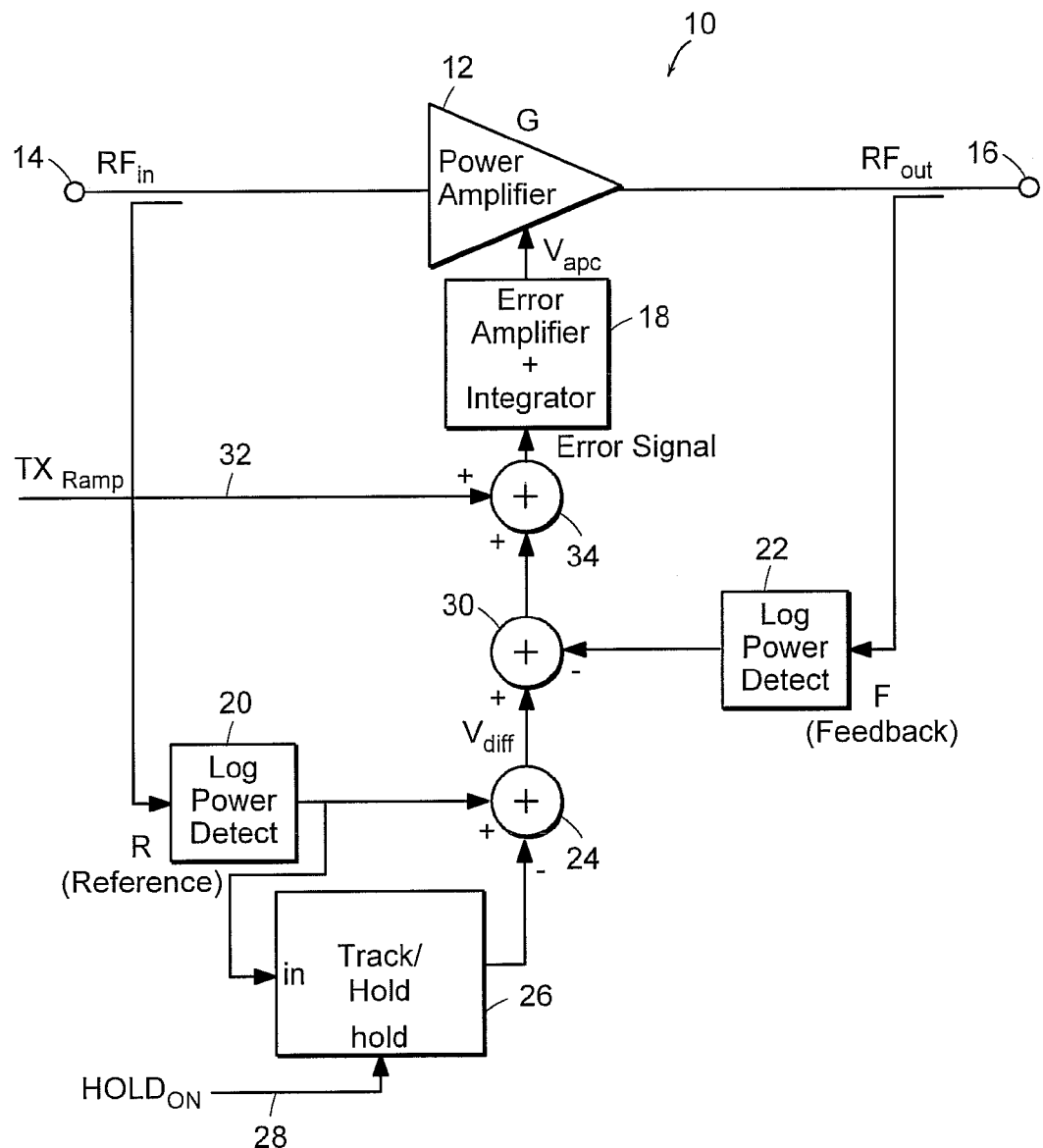
FIG. 1 shows an illustrative diagrammatic view of a system in accordance with an embodiment of the invention using a modulated RF signal as a reference signal.

The system incorporates a track-and-hold circuit in a power control system to accomplish closed loop power control that is insensitive to variations in the reference signal that are not a consequence of the intended modulation of the reference signal. As shown in FIG. 1, such a system 10 using a modulated RF signal for the reference information may include a power amplifier 12 between an RF input node 14 and an RF output node 16. The power amplifier 12 receives a corrective signal ($V_{apc}$) from an error amplifier and integrator unit 18. The system also includes a reference log power detect unit 20 that receives a sample of the $RF_{in}$ signal from the input node 14, and a feedback log power detect unit 22 that receives a sample of the $RF_{out}$ signal from the RF output node 16. The output of the reference log power detect unit 20 is provided to a first combiner 24 as well as to a track and hold unit 26, which also receives a $HOLD_{on}$ signal 28. The output of the track and hold unit 26 is subtracted from the output of the reference log power detect unit 20 by the first combiner 24. The output of the feedback log power detect unit 22 is subtracted from the output of the first combiner 24 at a second combiner 30, and the output of the second combiner 30 is added to a $TX_{Ramp}$ signal 32 at a third combiner 34. The output of the third combiner 34 is provided to the error amplifier and integrator unit 18.

Initially, the track-and-hold unit 26 tracks the measured reference power signal. The track-and-hold unit output is subtracted from the measured reference power signal, canceling out the influence of the measured reference power signal on the error signal. This causes the error signal to correspond solely to the difference between the ramp signal and the measured output power signal, and not the gain of the power amplifier or the reference signal power. When the track-and-hold unit is tracking, this system behaves identically to some GSM GMSK type closed loop power control systems.

The track-and-hold unit is switched to hold mode prior to beginning of the power ramp, holding the measured reference power level at the switching instant. During the hold time, the difference between the reference detector output and the track-and-hold output corresponds to the instantaneous envelope variations in the reference signal relative to the power level at the hold instant. These instantaneous variations are compared with the detected output power, and the control loop ensures that the output signal envelope variations track any instantaneous envelope variations on the reference signal, within the bandwidth of the feedback loop.

The power ramp signal is summed at the integrator input. In addition to any amplitude variations present on the output signal due to the non-constant envelope modulation of the reference signal, the feedback loop imposes additional amplitude variations to the output signal corresponding to the ramp signal.

Applying the difference between the instantaneous measured reference signal level to the measured reference signal level at a point in time corresponding to its average ensures that the feedback loop sets output power level independently of the average reference signal level. The output power, instead, becomes a function of the power detector characteristics, the instantaneous reference envelope variation, and the power ramp signal.

Figure 2:
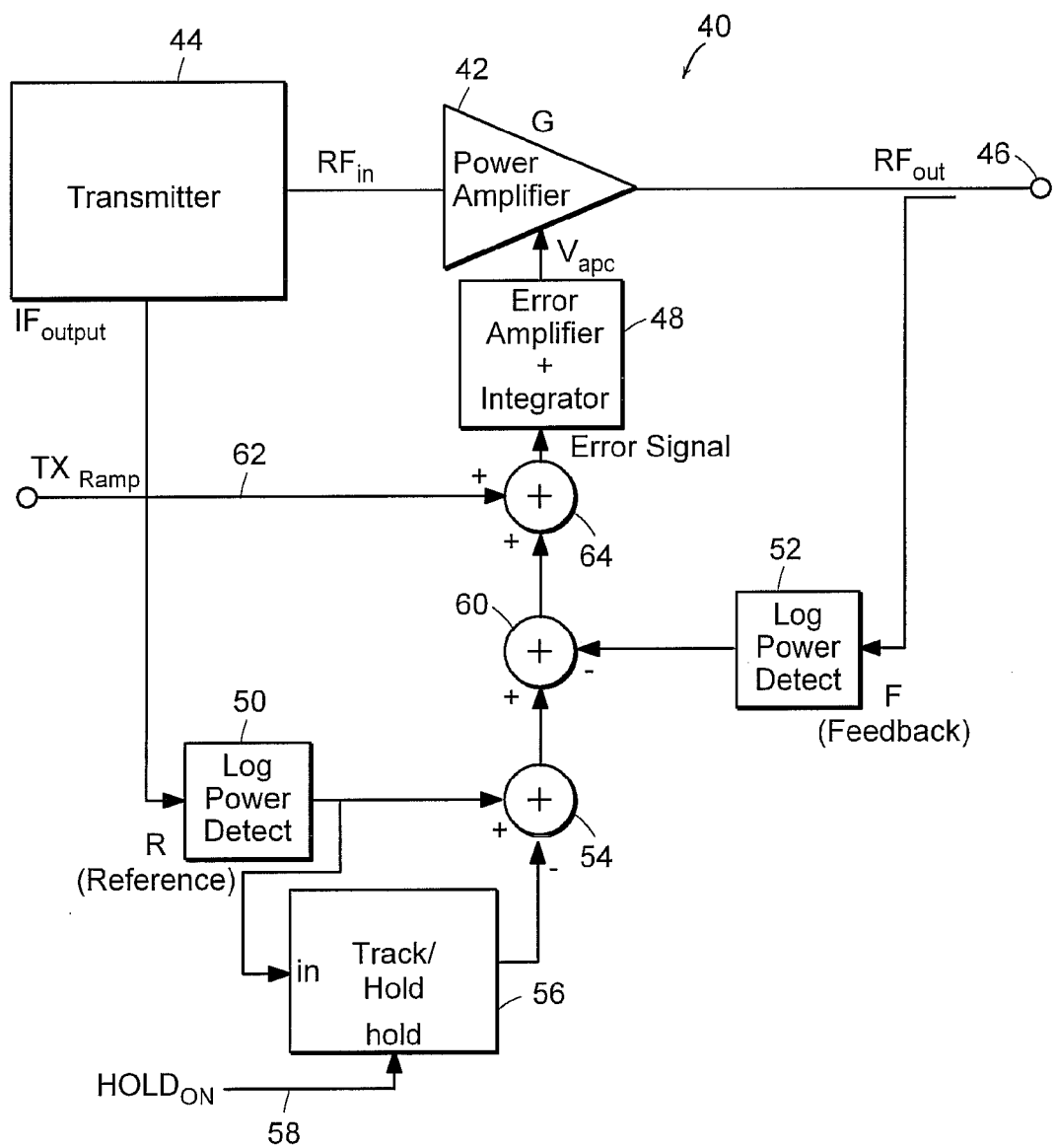
FIG. 2 shows an illustrative diagrammatic view of a system in accordance with another embodiment of the invention using a modulated IF signal as a reference signal.

In accordance with another embodiment, a system that uses a modulated IF signal for the reference information is shown in FIG. 2. This system 40 includes a power amplifier 42 between a transmitter unit 44 and an output node 46, and the power amplifier 42 also receives a corrective signal ($V_{apc}$) from an error amplifier and integrator unit 48. The system 40 includes a reference log power detect unit 50 that receives an $IF_{output}$ signal from the transmitter unit 44, and a feedback log power detect unit 52 that receives the $RF_{out}$ signal from the RF output node 46. The output of the reference log power detect unit 50 is provided to a first combiner 54 as well as to a track and hold unit 56, which also receives an $HOLD_{on}$ signal 58. The output of the track and hold unit 56 is subtracted from the output of the reference log power detect unit 50 by the first combiner 54. The output of the feedback log power detect unit 52 is subtracted from the output of the first combiner 54 at a second combiner 60, and the output of the second combiner 60 is added to a $TX_{Ramp}$ signal 62 at a third combiner 64. The output of the third combiner 64 is provided to the error amplifier and integrator unit 48.

Figure 3:
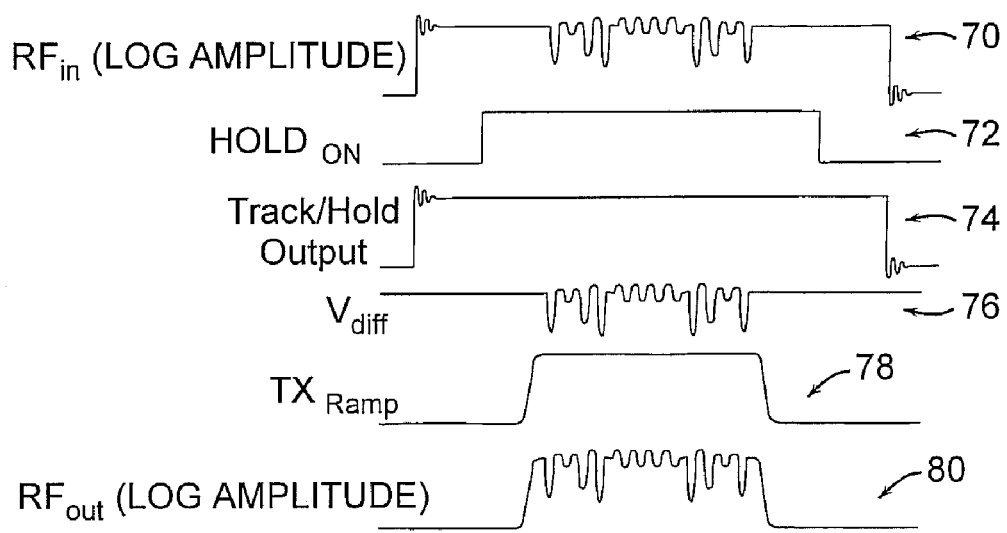
FIG. 3 shows illustrative diagrammatic timing diagrams of control and signal lines in a system in accordance with an embodiment of the invention.

FIG. 3 shows detailed views of certain of the control and signal lines of this technique. Initially, a constant envelope signal (or a close approximation to it) is provided to the reference input 70, and the track-and-hold circuit tracks the measured power level of the reference signal. The $HOLD_{on}$ signal is shown at 72. The track-and-hold output 74 is subtracted from the measured reference signal 70, the difference being zero. The track-and-hold is then commanded to hold its input, after which time any amplitude variations in the reference signal will present themselves on the difference signal 76. When a ramp signal 78 is applied, the output power 80 increases in a corresponding manner to the ramp. Non-constant envelope modulation appears on the reference signal shortly after the ramp signal appears, and because the track-and-hold is already in hold mode at this time, reference signal amplitude modulation is presented on the difference signal. In order to maintain zero error signal at the integrator input, the control loop forces the output power amplitude to track these envelope variations, to within the bandwidth of the feedback loop.

In addition to providing power control, this circuit can provide linearization of the power amplifier. If the power amplifier gain varies due to compression or thermal effects while the system is in the hold mode this circuit can correct for the gain variations in the power amplifier. To do this, it is necessary that the control loop bandwidth exceed the modulation bandwidth of the reference signal. If it is not necessary to correct for gain variations in the power amplifier, then it is not necessary that the control loop bandwidth exceed the modulation bandwidth and the control loop bandwidth need only exceed the bandwidth of the ramp signal.

This invention may be useful for multimode transmitters involving constant and non-constant envelope signals, such as GSM (constant-envelope) and EDGE (non-constant envelope). In this situation, the track-and-hold circuit is kept in track mode for any GSM burst, giving a circuit which is equivalent to a conventional GMSK closed loop power controller. For any EDGE burst, the track-and-hold circuit is switched to hold in the manner previously discussed.

The above systems differ from other RF power control methods in that they use a track-and-hold function to track and hold a measurement signal corresponding to the power level of a reference NCE modulation signal. The track-and-hold circuit enables the systems to perform closed loop power control in a manner that is insensitive to variations in the reference signal, when these variations are not a consequence of the intended modulation. Such systems should also be robust and relatively easy to implement.

In further embodiments, the baseband I and Q signals may be used for the reference information. In many conventional radio transmitters, these i(t) and q(t) signals are generated by means of digital baseband processors. By various means, the carrier signal is modulated with these I and Q baseband signals. The instantaneous power level of the modulated signal will be a function of these I and Q baseband signals. A modulated waveform may be described with an equation of the form:

$$S(t)=i(t)\cos \omega_c t+q(t)\sin \omega_c t$$

Figure 4:
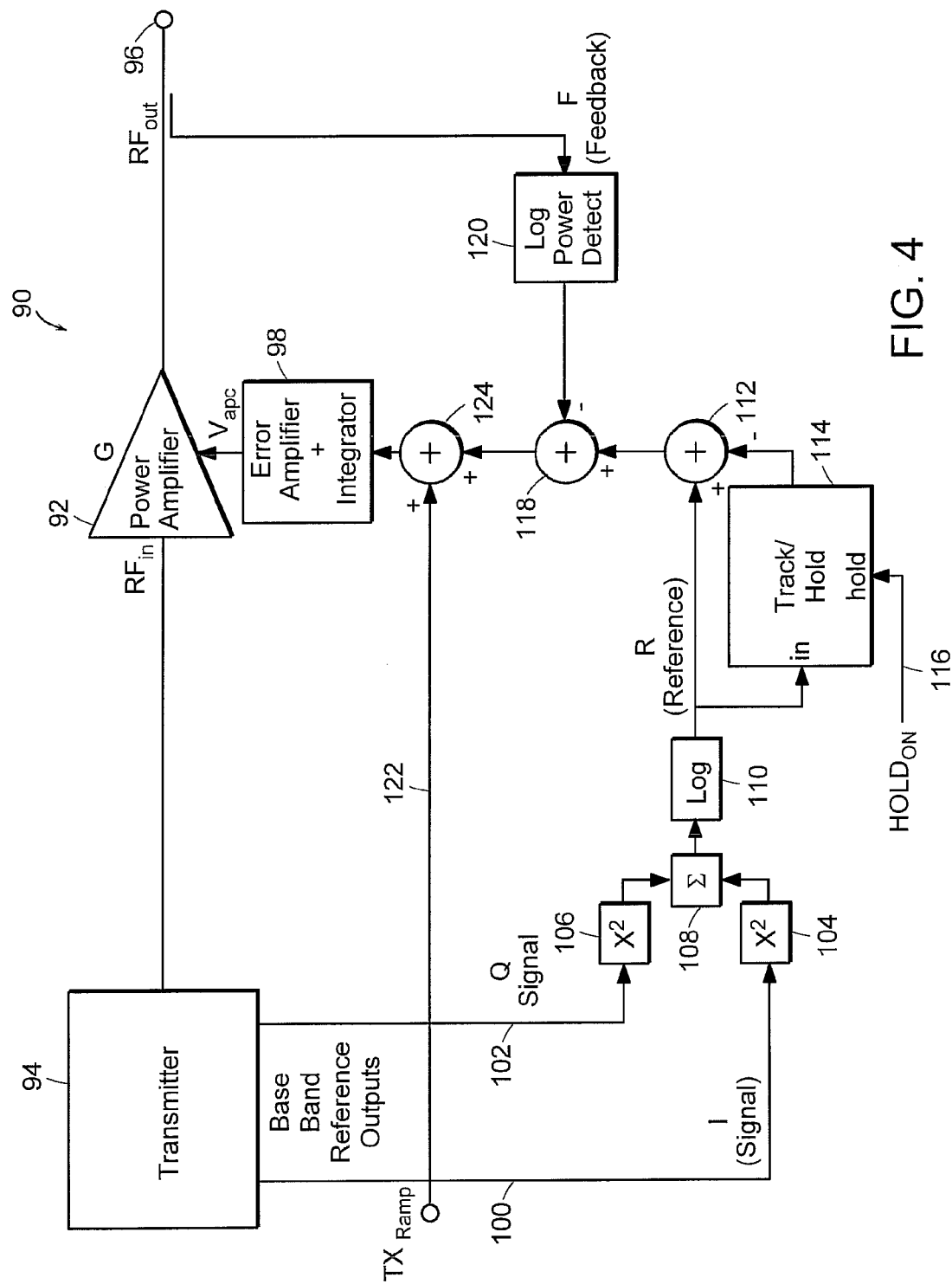
FIG. 4 shows an illustrative diagrammatic view of a system in accordance with a further embodiment of the invention using baseband I and Q signals for reference information.

The power level therefore, of the reference signal may be determined using the baseband signals instead of a modulated signal at some carrier frequency. As shown in FIG. 4, such a system 90 may include a power amplifier 92 between a transmitter unit 94 and an output node 96. The power amplifier 92 receives a corrective signal ($V_{apc}$) from an error amplifier and integrator unit 98. Baseband I and Q reference signals 100, 102 are provided from the transmitter unit 94 to a pair of squaring units 104, 106 respectively as shown, and the outputs of the squaring units 104 and 106 are summed at a summing unit 108. The summed square of the I and Q signals is proportionate to the instantaneous power level of the desired modulated output signal. The summed signal from the combiner 108 is provided to a log unit 110 (this is not the same type of log device as 20, 22, 50 or 52 in FIGS. 1 and 2), and the output of the log unit 110 is provided to a first combiner 112. The output from the log unit 110 is also provided to a track and hold unit 114, which also receives an $HOLD_{ON}$ signal 116 as shown. The output of the track and hold unit 114 is subtracted from the output of the log unit 110 by the first combiner 112, and the output of the combiner 112 is provided to a second combiner 118 as the system reference signal. The system also includes a log power detect unit 120 that is coupled to the output signal, and the output of the power detect unit 120 is subtracted at the second combiner 118 as a feedback signal. The output of the second combiner is combined with a $TX_{Ramp}$ signal 122 by a third combiner 124, and the output of the third combiner 124 is provided to the error amplifier and integrator unit 98. Depending on the implementation, the baseband signals may be available in analog or digital form, and the reference power level may be determined by either analog or digital means, or some combination of these. The track and hold function may be implemented by either analog or digital means. The combiners are separately discussed above for clarity and may be provided as a single combiner unit in certain embodiments.

Using baseband signals permits computation of the reference power level in the digital domain. Digital computation of the reference power may be more efficient than analog computation. This efficiency may be in terms of circuitry, size, power consumption, and other considerations. Determination of the reference power level may be done more accurately using the baseband signals instead of modulated carrier signals. This is due to imperfections in the modulation process.

Those skilled in the art will appreciate that numerous modifications and variations may be made to the above disclosed embodiments without departing from the spirit and scope of the invention.

What is claimed is:

1. A radio frequency output power control system for use in communication systems that use a modulation scheme having a non-constant amplitude envelope, said power control system comprising:

a power amplifier having a power amplifier input for receiving an input signal with a non-constant amplitude envelope, a power control input for receiving a power control signal, and a power amplifier output for providing an amplified output signal;

a track and hold circuit for tracking a measured reference power signal that is representative of a modulation of the input signal; and subtraction means for subtracting an output of said track and hold circuit from said measured reference power signal that is representative of the modulation of the input signal, and subtracting a feedback signal that is representative of a modulation of the amplifier output signal a difference between from said measured reference power signal the output of said track and hold circuit to provide a power control signal that is coupled to the power control input, such that said power control signal is responsive to the feedback signal, the output of said track and hold circuit, and the measured reference power signal.

2. The radio frequency output power control system as claimed in claim 1, wherein said track and hold circuit and said measured reference power signal are coupled to the input signal via a logarithmic power detect unit.

3. The radio frequency output power control system as claimed in claim 1, wherein the track and hold circuit is responsive to a $HOLD_{on}$ signal.

4. The radio frequency output power control system as claimed in claim 1, wherein said input signal is an IF output signal provided by a transmitter unit.

5. The radio frequency output power control system as claimed in claim 1, wherein said input signal comprises baseband reference outputs from a transmitter unit.

6. The radio frequency output power control system as claimed in claim 5, wherein said system further includes a pair of squaring units.

7. The radio frequency output power control system as claimed in claim 1, wherein said track and hold circuit is coupled to said power amplifier via an error amplifier.

8. The radio frequency output power control system as claimed in claim 1, wherein said system is employed to control power for a modulated signal with non-constant envelope.

9. The radio frequency output power control system as claimed in claim 1, wherein said system is further responsive to a $TX_{Ramp}$ signal.

10. The radio frequency output power control system as claimed in claim 1, wherein said system further includes a feedback logarithmic power detect unit.

11. A radio frequency output power control system for use in communication systems that use a modulation scheme having a non-constant amplitude envelope, said power control system comprising:

a power amplifier having an input to receive an input signal with a non-constant amplitude envelope, a power control input for receiving a power control signal, and an output for providing an amplified output signal;

a track and hold circuit for tracking a reference signal;

a first combiner for providing a difference between said reference signal and an output signal of said track and hold circuit, and a second combiner for providing a difference between a feedback signal and an output of said first combiner, wherein said power control signal is responsive to the difference between the feedback signal and the output of the first combiner.

12. The radio frequency output power control system as claimed in claim 11, wherein said control system further includes a third combiner for providing a sum of a $TX_{Ramp}$ signal an an output of said second combiner, wherein said power control signal is responsive to the sum of the $TX_{Ramp}$ signal and the output of the second combiner.

13. The radio frequency output power control system as claimed in claim 12, wherein said first combiner, said second combiner, and said third combiner are all provided in a single combiner unit.

14. A radio frequency output power control system comprising:

a power amplifier coupled to an input signal for providing an amplifier output signal;

a reference logarithmic unit coupled to a reference signal that is representative of a modulation of the input signal;

a track and hold circuit coupled to said reference signal;

a feedback logarithmic unit coupled to a feedback signal that is representative of a modulation of the amplifier output signal; and combiner means for providing a corrective signal to said power amplifier responsive to said reference signal, an output signal from said track and hold circuit, and said feedback signal by subtracting said output of said track and hold circuit from said reference signal that is representative of a modulation of the input signal, and subtracting said feedback signal from a difference between said reference signal the output of said track and hold circuit to provide the corrective signal that is coupled to the power amplifier.

15. The radio frequency output power control system as claimed in claim 14, wherein said reference signal includes a modulated RF signal.

16. The radio frequency output power control system as claimed in claim 14, wherein said reference signal includes a modulated IF signal.

17. The radio frequency output power control system as claimed in claim 14, wherein said reference signal includes baseband I and Q signals.

18. The radio frequency output power control system as claimed in claim 17, wherein said system is employed to control power for a modulated signal with non-constant envelope.

19. The radio frequency output power control system as claimed in claim 14, wherein said combiner means is further responsive to a $TX_{Ramp}$ signal.

20. The radio frequency output power control system as claimed in claim 14, wherein said track and hold circuit is responsive to a $HOLD_{on}$ signal.

* * * * *